United States Patent [19]

Hyde et al.

[11] Patent Number: 4,724,389
[45] Date of Patent: Feb. 9, 1988

[54] LOOP-GAP RESONATOR FOR LOCALIZED NMR IMAGING

[75] Inventors: James S. Hyde, Dousman, Wis.; Wojciech Froncisz, Krakow, Poland; Andrzej Jesmanowicz, Milwaukee, Wis.

[73] Assignee: Medical College of Wisconsin, Inc., Milwaukee, Wis.

[21] Appl. No.: 731,923

[22] Filed: May 8, 1985

[51] Int. Cl.[4] .............................................. G01R 33/20
[52] U.S. Cl. .................................... 324/318; 324/316; 333/219
[58] Field of Search ............... 324/318, 316, 322, 307, 324/309; 333/219, 227, 228, 235

[56] References Cited

U.S. PATENT DOCUMENTS

| 3,932,805 | 1/1976 | Abe et al. | 324/309 |
| 3,949,388 | 4/1976 | Fuller | 340/870.28 |
| 4,394,645 | 7/1983 | Humble et al. | 340/572 |
| 4,417,209 | 11/1983 | Hounsfield | 324/309 |
| 4,435,680 | 3/1984 | Froncisz et al. | 324/316 |
| 4,446,429 | 5/1984 | Froncisz et al. | 324/316 |
| 4,480,239 | 10/1984 | Hyde et al. | 333/219 |
| 4,504,788 | 3/1985 | Froncisz et al. | 324/316 |
| 4,570,137 | 2/1986 | DiSilvestro | 333/219 |
| 4,607,225 | 8/1986 | Crooks | 324/318 |

FOREIGN PATENT DOCUMENTS

| 2448544 | 5/1975 | Fed. Rep. of Germany | 333/219 |
| 2159958 | 12/1985 | United Kingdom | 324/307 |

OTHER PUBLICATIONS

Battocletti et al., Nuclear . . . Measurement, J. of Microwave Power, 18(3), 1983, pp. 221–232.
Battocletti et al., Flat Crossed-Coil . . . Resonance, Med. and Biol. Eng. and Comput., vol. 17, Mar. 1979, pp. 183–191.

Primary Examiner—Stewart J. Levy
Assistant Examiner—Scott M. Oldham
Attorney, Agent, or Firm—Quarles & Brady

[57] ABSTRACT

A local probe for use in nuclear magnetic resonance imaging includes a pair of loop-gap resonators which are connected together and positioned adjacent a region of interest. FID signals produced in the region of interest induce signals in coupling loops mounted near each loop-gap resonator, and these connect to a transmission line leading to the receiver. Three embodiments are disclosed, one best suited for imaging appendages, a second best suited for imaging the head and neck, and a third best suited for the spine.

20 Claims, 17 Drawing Figures

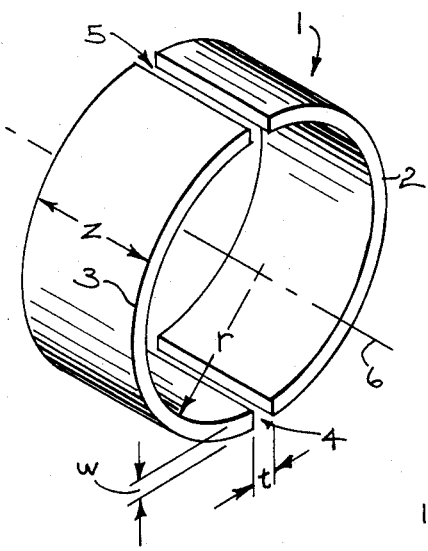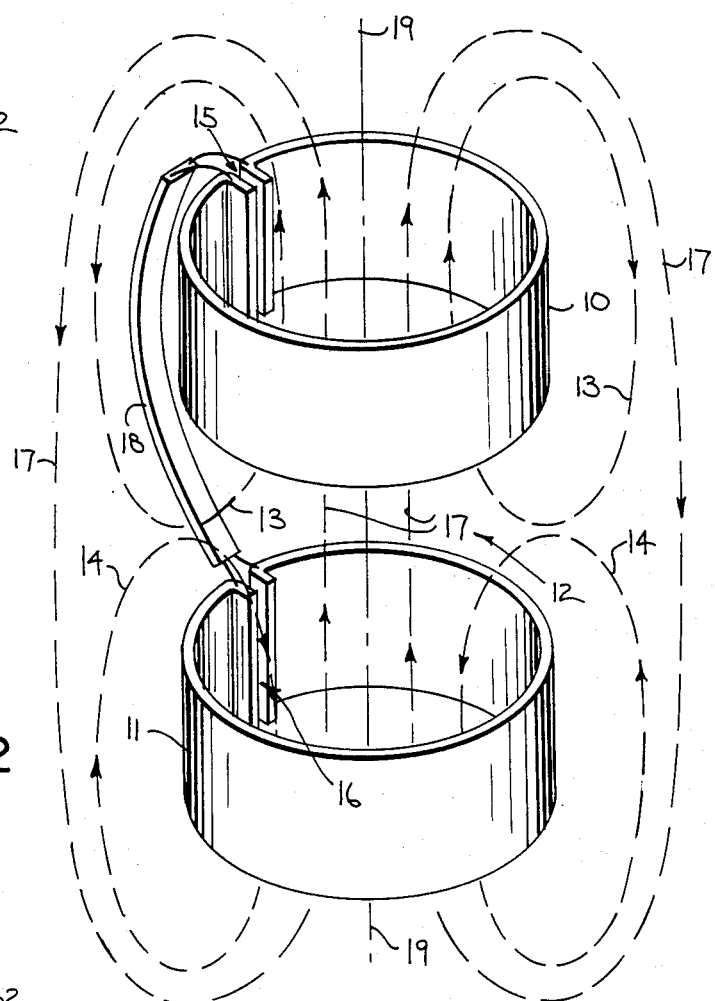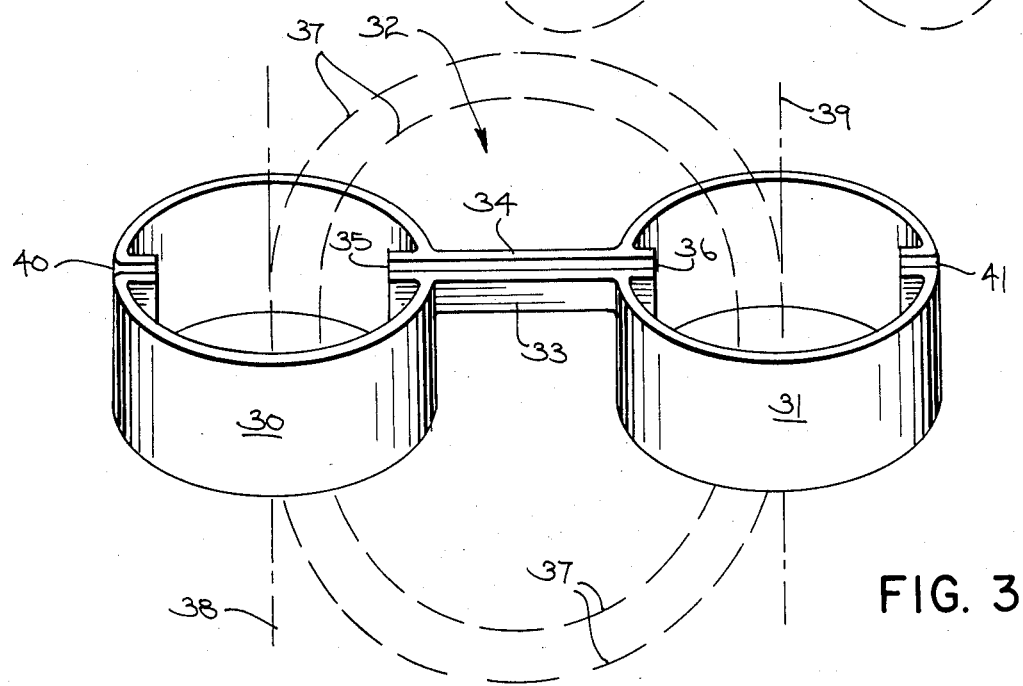
FIG. 1
FIG. 2
FIG. 3

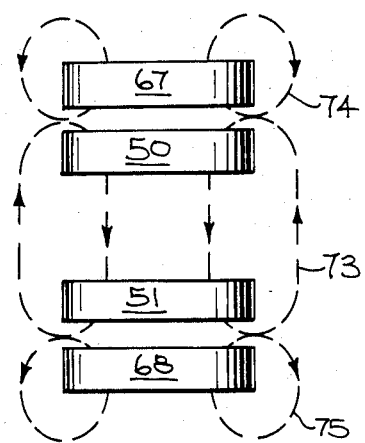
FIG. 5a
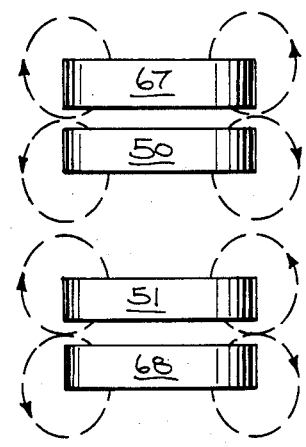
FIG. 5b
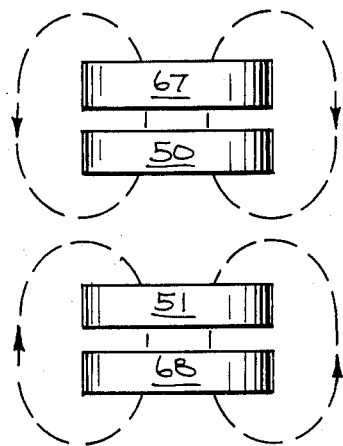
FIG. 5c
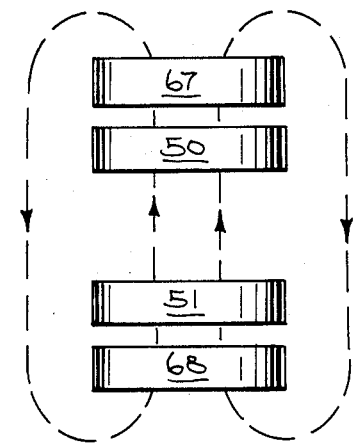
FIG. 5d
FIG. 8a
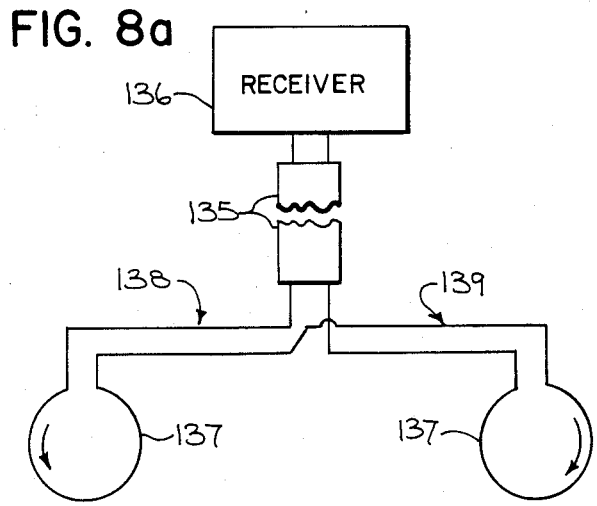
FIG. 8b
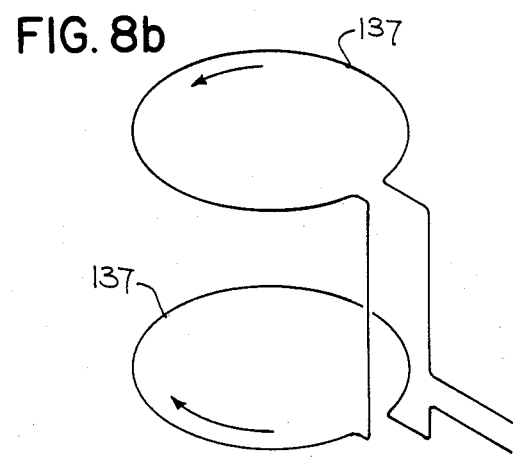

LOOP-GAP RESONATOR FOR LOCALIZED NMR IMAGING

The U.S. Government has a paid-up license in this invention and the right in limited circumstances to require the patent owner to license others on reasonable terms as provided for by the terms of Grant No. GM27665 awarded by the National Institute of Health.

BACKGROUND OF THE INVENTION

The field of the invention is gyromagnetic resonance spectroscopy, and particularly, nuclear magnetic resonance (NMR) techniques for measuring the properties of materials.

Gyromagnetic resonance spectroscopy is conducted to study nuclei that have magnetic moments and electrons which are in a paramagnetic state. The former is referred to in the art as nuclear magnetic resonance (NMR), and the latter is referred to as paramagnetic resonance (EPR) or electron spin resonance (ESR). There are other forms of gyromagnetic spectroscopy that are practiced less frequently, but are also included in the field of this invention.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus).

When a substance such as human tissue is subjected to a uniform magnetic field (polarizing field $B_z$) the individual magnetic moments of the paramagnetic nuclei in the tissue attempt to align with this field, but precess about it in random order at their characteristic Larmor frequency. A net magnetic moment $M_z$ is produced in the direction of the polarizing field, but the randomly oriented components in the perpendicular plane (x-y plane) cancel one another. If, however the substance, or tissue is irradiated with a magnetic field (excitation field $B_1$) which is in the x-y plane and which is near the Larmor frequency, the net aligned moment, $M_z$, can be rotated into the x-y plane to produce a net transverse magnetic moment $M_1$ which is rotating in the x-y plane at the Larmor frequency. The degree to which the rotation of $M_z$ into an $M_1$ component is achieved, and hence, the magnitude and the direction of the net magnetic moment ($M = M_0 + M_1$) depends primarily on the length of time of the applied excitation field $B_1$.

The practical value of this gyromagnetic phenomena resides in the radio signal which is emitted after the excitation signal $B_1$ is terminated. When the excitation signal is removed, an oscillating sine wave is induced in a receiving coil by the rotating field produced by the transverse magnetic moment $M_1$. The frequency of this signal is the Larmor frequency, and its initial amplitude, $A_0$, is determined by the magnitude of $M_1$. The amplitude A of the emission signal (in simple systems) decays in an exponential fashion with time, t:

$A = A_0 e^{-t/T_2}$

The decay constant $1/T_2$ is a characteristic of the process and it provides valuable information about the substance under study. The time constant $T_2$ is referred to as the "spin-spin relaxation" constant, or the "transverse relaxation" constant, and it measures the rate at which the aligned precession of the nuclei dephase after removal of the excitation signal $B_1$.

Other factors contribute to the amplitude of the free induction decay (FID) signal which is defined by the $T_2$ spin-spin relaxation process. One of these is referred to as the spin-lattice relaxation process which is characterized by the time constant $T_1$. This is also called the longitudinal relaxation process as it describes the recovery of the net magnetic moment M to its equilibrium value $M_0$ along the axis of magnetic polarization (Z). The $T_1$ time constant is longer than $T_2$, much longer in most substances, and its independent measurement is the subject of many gyromagnetic procedures.

The measurements described above are called "pulsed NMR measurements." They are divided into a period of excitation and a period of emission. As will be discussed in more detail below, this measurement cycle may be repeated many times to accumulate different data during each cycle or to make the same measurement at different locations in the subject. A variety of preparative excitation techniques are known which involve the application of one or more excitation pulses of varying duration. Such preparative excitation techniques are employed to "sensitize" the subsequently observed free induction decay signal (FID) to a particular phenomenon. Some of these excitation techniques are disclosed in U.S. Pat. Nos. 4,339,716; 4,345,207; 4,201,726; 4,155,730 and 3,474,329.

Although NMR measurements are useful in many scientific and engineering fields, their potential use in the field of medicine is enormous. NMR measurements provide a contrast mechanism which is quite different from x-rays, and this enables differences between soft tissues to be observed with NMR which are completely indiscernible with x-rays. In addition, physiological differences can be observed with NMR measurements, whereas x-rays are limited primarily to anatomical studies.

For most medical applications utilizing NMR, an imaging technique must be employed to obtain gyromagnetic information at specific locations in the subject. The foremost NMR imaging technique is referred to as "zeugmatography" and was first proposed by P. C. Lauterbur in a publication "Image Formation by Induced Local Interactions: Examples Employing Nuclear Magnetic Resonance", Nature, Vol. 242, Mar. 16, 1973, pp. 190-191. Zeugmatography employs one or more additional magnetic fields which have the same direction as the polarizing field $B_0$, but which have a nonzero gradient. By varying the strength (G) of these gradients, the net strength of the polarizing field $B_0 = B_z + G_x X + G_y Y + G_z Z$ at any location can be varied. As a result, if the frequency response of the FID receiver coil and circuitry is narrowed to respond to a single frequency, $\omega_0$, then gyromagnetic phenomena will be observed only at a location where the net polarizing field $B_0$ is of the proper strength to satisfy the Larmor equation; $\omega_0 = \gamma B_0$: where $\omega_0$ is the larmor frequency at that location.

By "linking" the resulting free induction signal FID with the strengths of the gradients ($G = G_x, G_y, G_z$) at the moment the signal is generated, the NMR signal is "tagged", or "sensitized", with position information. Such position sensitizing of the NMR signal enables an NMR image to be produced by a series of measurements. Such NMR imaging methods have been classified as point methods, line methods, plane methods and three dimensional methods. These are discussed, for example, by P. Mansfield and P. G. Morris in their book "NMR Imaging in Biomedicine" published in 1982 by Academic Press, New York.

The NMR scanners which implement these techniques are constructed in a variety of sizes. Small, specially designed machines, are employed to examine laboratory animals or to provide images of specific parts of the human body. On the other hand, "whole body" NMR scanners are sufficiently large to receive an entire human body and produce an image of any portion thereof.

There are a number of techniques employed to produce the excitation field ($B_1$) and receive the FID signal. The simplest and most commonly used structure is a single coil and associated tuning capacitor which serves to both produce the excitation signal and receive the resulting FID signal. This resonant circuit is electronically switched between the excitation circuitry and the receiver circuitry during each measurement cycle. Such structure are quite commonly employed in both small NMR scanners and whole body NMR scanners.

As one might expect, it is also quite common to employ separate excitation coils and receiver coils. While such NMR scanners require additional hardware, the complexities of electronic switching associated with the use of a single coil are eliminated and specially designed coils may be employed for the excitation and receiver functions. For example, in whole body NMR scanners it is desirable to produce a circularly polarized excitation field ($B_1$) by using two pairs of coils which are orthogonally oriented, and which are driven with separate excitation signals that are phase shifted 90° with respect to each other. Such an excitation field is not possible with a single coil.

It is very difficult to construct a large coil which has both a uniform and high sensitivity to the FID signal produced in a whole body NMR scanner. As a result, another commonly used technique is to employ "local" coils to either generate the excitation signal ($B_1$), receive the resulting FID signal, or both generate and receive. Such local coils are relatively small and are constructed to produce the desired field or receive the FID signal from a localized portion of the patient. For example, different local coils may be employed for imaging the head and neck, legs and arms, or various internal organs. When used as a receiver, the local coil should be designed to provide a relatively uniform sensitivity to the FID signals produced by the precessing nuclei throughout the region of interest.

Recently a novel resonator structure, referred to in the art as a "loop-gap" resonator, has been applied to the field of gyromagnetic resonance spectroscopy. As indicated in U.S. Pat. Nos. 4,435,680; 4,446,429; 4,480,239 and 4,504,588, the loop-gap resonator may take a wide variety of shapes. In all cases, however, a lumped circuit resonator is formed in which a conductive loop is the inductive element and one or more gaps are formed in this loop to form a capacitive element. While the loop-gap resonator has many desirable characteristics normally associated with lumped circuit resonators, it also has some characteristics normally associated with cavity resonators. Most notable of these is the much higher quality factor, or "Q", of the loop-gap resonator over the traditional lumped circuit resonators. When applied to NMR scanners, this higher Q translates into higher resolution images.

SUMMARY OF THE INVENTION

The present invention relates to a local probe for use in NMR imaging of selected portions of a patient, and particularly, to a local probe which employs loop-gap resonators that enhance the quality of the resulting images. More specifically, the present invention includes a pair of loop-gap resonators which are positioned adjacent to one another, and in which a capacitive element in each loop-gap resonator is electrically connected to the capacitive element in the other loop-gap resonator to link the two loop-gap resonators and to thereby define a region of relatively uniform sensitivity therebetween. It has been discovered that when a pair of loop-gap resonators are positioned adjacent to one another, there are two resonant modes, corresponding to the magnetic flux passing through the loops in the same direction or in opposite directions. The resonant frequencies of these two modes will be different because of the mutual inductance between the two loops. When the loop-gap resonators are close together, these resonant frequencies are substantially different, but as the resonators are separated, the two resonant frequencies merge, or "degenerate." A teaching of the present invention is that a region of relatively uniform sensitivity can be achieved between spaced loop-gap resonators by suppressing one of these resonant modes with connections between their respective capacitive elements. When the undesired mode is suppressed in this manner, the two loop-gap resonators are said to be "linked."

A general object of the invention is to provide a local probe which may be employed to image many different regions of the human anatomy. This is accomplished in part by mounting the two loop-gap resonators to a support arm which may be adjusted in length to alter the lateral spacing between the loop-gap resonators. The loop-gap resonators may also be rotatably connected to the support arm such that they can be aligned along a common axis to form an axial pair, or they can be rotated through a range of orientations to form a planar pair in which there respective axes are substantially perpendicular to the common axis. By adjusting the lateral spacing and the rotational orientation of the loop-gap resonators, the sensitivity region formed therebetween can be shaped to fit a wide variety of applications.

Another object of the invention is to provide a probe which is sensitive to the FID signals produced in the region of interest, but is relatively insensitive to the excitation signal produced by a separate coil. When the loop-gap resonators are rotated to form a planar pair, they are insensitive to excitation fields which are perpendicular to their axes. If the loop-gap resonators are also substantially physically identical such that there is geometric symmetry about a plane therebetween, the probe is also insensitive to excitation fields parallel to the axes of the loop-gap resonators. This is particularly advantageous when circularly polarized excitation fields are separately produced, since such fields have components parallel to and perpendicular to the loop-gap resonator axes.

A more specific object of the present invention is to provide a probe which need not be "retuned" for each patient. This is accomplished in part by providing multiple gaps in each loop-gap resonator to reduce the potentials thereacross and reduce the intensity of the resulting electric fields. This effect is further enhanced by increasing the lengthwise dimension (Z) of each loop-gap resonator.

Yet another object of the invention is to provide a probe which is sensitive to FID signals produced at different frequencies. Each loop-gap resonator pair resonates in two modes. The resonant frequency of each of these modes can be fixed by the geometry of the loops, the spacing between the loops and the geometry of their gaps. One frequency may be set, for example, to detect the FID signal produced by hydrogen nuclei, and the second frequency may be set to detect phosphorous or sodium nuclei.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIG. 1 is a perspective view of a loop-gap resonator employed in the present invention;

FIG. 2 is a perspective view of a pair of loop-gap resonators coupled to form an axial pair;

FIG. 3 is a perspective view of a pair of loop-gap resonators coupled to form a planar pair;

FIGS. 5a-5d are schematic representations of the four resonance modes of the embodiment of FIG. 4;

FIGS. 8a and 8b are an electrical schematic diagrams of the coupling coils which form a part of the embodiment of FIG. 6;

DESCRIPTION OF THE PREFERRED EMBODIMENT

Figure 4A:
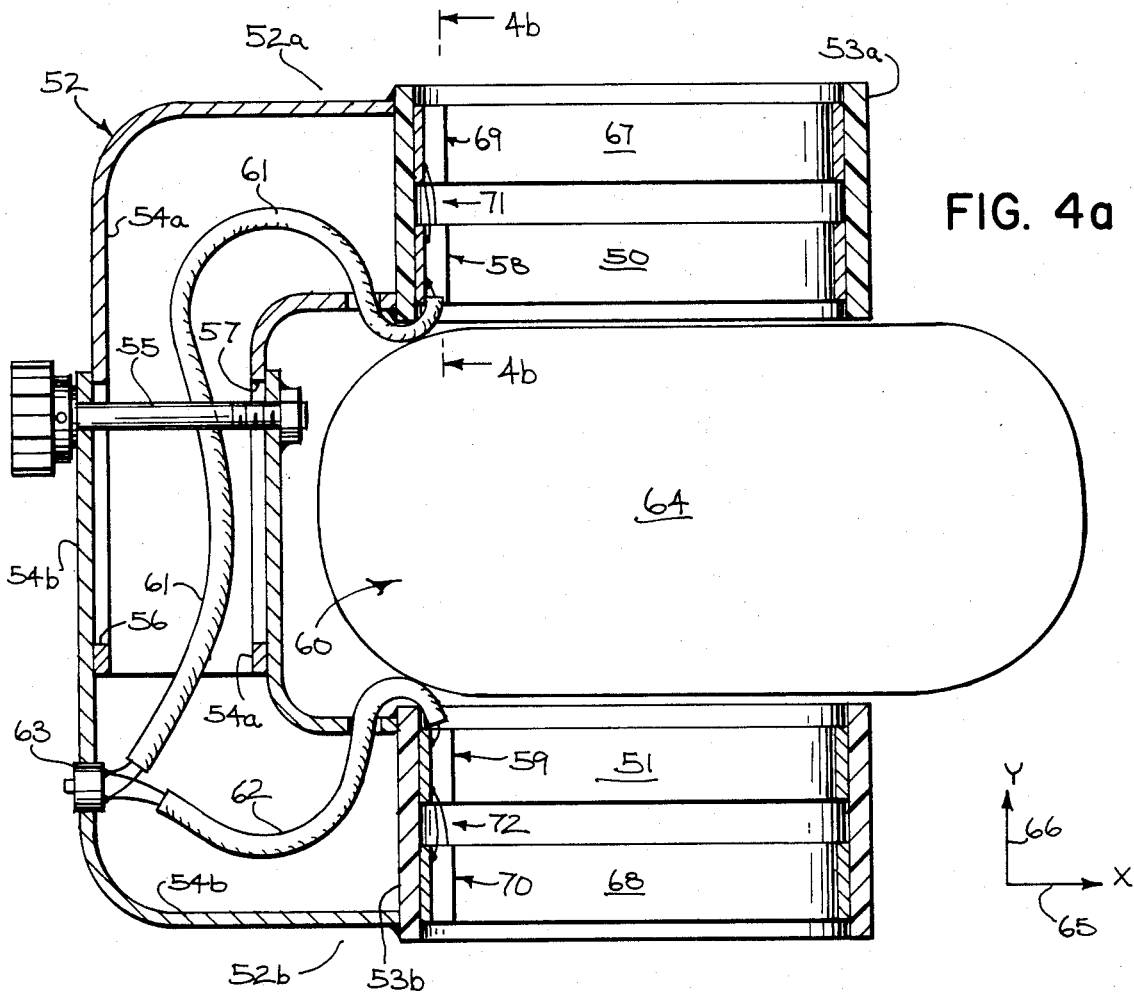
FIG. 4a is an elevation view with parts cut away of a first preferred embodiment of the invention.

Referring particularly to FIG. 1, the loop-gap resonator 1 which is employed in the present invention is a lumped circuit resonator which resonates at a radio frequency determined by its geometry. The lumped circuit resonator 1 has dimensions which are much less than the wavelength of the radio frequency signal at which it resonates. The capacitive and inductive elements are identifiable and the electromagnetic field oscillates between a magnetic field generated by the inductive element and an electric field generated by the capacitive element.

The inductive element in the resonator 1 is the loop, or ring, formed by two metallic pieces 2 and 3, and the capacitive element is the longitudinal gaps 4 and 5 formed at the juncture of the two pieces 2 and 3. The magnetic field produced by the resonator 1 is concentrated along a central axis 6, and the electric field is concentrated in the gaps 4 and 5. The magnetic flux flows through the opening defined by the loop and curves radially outward at each of its ends and along the outside of the loop to form a closed flux path. The resonant frequency of the resonator 1 is determined primarily by its geometry, and it can be constructed to operate over a wide range of frequencies of interest in gyromagnetic spectroscopy. Where the spacing (t) in the gaps 4 and 5 is much smaller than their width (w), the resonant frequency of a loop-gap resonator is as follows:

$$F = \frac{1}{2\pi}\left(\frac{1}{LC}\right)^{\frac{1}{2}}$$

where:

$$L = \frac{\mu \pi r^2}{Z}$$

$$\frac{1}{C} = \sum_{m=1}^{n} \frac{t_m}{\epsilon W_m Z}$$

$\epsilon$ = the dielectric constant of the material in the gaps;
$\mu$ = the permeability of free space;
$n$ = the number of gaps, each having dimensions $t_m$ and $W_m$; and
$z$ = the length of the resonator 1 in the direction of the central axis 6.

There are a number of characteristics of the loop-gap resonator which are important when applying them to practical use. First, the length (Z) has virtually no effect on the resonant frequency. Second, one or more gaps may be employed and these need not be of equal dimensions or provide equal capacitance. The loop need not be circular, although there are often advantages to a circular construction as will be described in more detail below. And finally, energy may be applied or removed from the loop-gap resonator in either of two ways. Energy may be inductively coupled to or from the resonator by a conductive loop which encircles magnetic flux flowing through the loops and which connects to the end of a transmission line. Alternatively, energy can be capacitively coupled to or from the resonator by connecting the transmission line to the plates of one of the resonator's capacitive elements through an impedance matching network.

Referring to FIG. 2, the present invention employs two loop-gap resonators 10 and 11 which are spaced from one another to define a region 12 therebetween for receiving a material to be examined. When placed next to each other in this manner, the loop-gap resonators 10 and 11 will resonate in two modes. The first mode, referred to herein as the "unlinked" mode, is indicated by the dashed lines 13 and 14 which represent the paths of the magnetic flux flowing through each loop-gap resonator 10 and 11 in the opposite directions. The second resonant mode, referred to herein as the "linked" mode, is indicated by the dashed lines 17 which represent the paths of the magnetic flux flowing through each resonator 10 and 11 in the same direction. When the loop-gap resonators 10 and 11 are closely spaced, the frequency of each of these resonant modes is substantially different due to the mutual inductance. However, when the loop-gap resonators 10 and 11 are spaced apart as shown in FIG. 2 to define the region 12, these resonant frequencies merge together. As a result the sensitivity in the region 12 to an FID signal at this merged frequency is not uniform.

The solution is to suppress the undesired resonant mode. This is accomplished by providing electrical connections between the "plates" of the respective gaps 15 and 16 in the resonators 10 and 11. By forcing the electric potential between corresponding plates in the respective gaps 15 and 16 to zero, the unlinked resonant mode is suppressed and the fields indicated by dashed lines 13 and 14 are not produced. As a result, the resonator pair operate in their linked resonant mode to produce a relatively uniform sensitivity in the region 12. While the electrical connection can be made in a number of ways, in the preferred embodiment a pair of flexible, insulated wires 18 are employed for this purpose.

In the embodiment of FIG. 2 the central axes of the respective loop-gap resonators 10 and 11 are aligned along a common axis 19. This arrangement is referred to hereinafter as an "axial pair". As will become apparent from the description below, this arrangement is particularly well suited for producing images of certain portions of the human anatomy, such as a patient's arms or legs.

Referring particularly to FIG. 3, the loop-gap resonators 30 and 31 in a second embodiment of the invention are aligned side-by-side to provide a "planar pair" which produces a region of relatively uniform sensitivity at 32. A pair of plates 33 and 34 connect between corresponding surfaces of the gaps 35 and 36 to suppress their unlinked mode of operation and produce a relatively uniform magnetic field in the region 32 as indicated by dashed lines 37. In this planar pair orientation the central axes 38 and 39 of the respective loop-gap resonators 30 and 31 are not coaxial, but are substantially parallel to each other.

There are a number of other noteworthy variations in the second embodiment. First, the connecting plates 33 and 34 may be rigid, and may provide additional capacitance which contributes to the determination of the resonant frequency of the linked pair as indicated by the above equation. Second, due to the symmetry and orientation of the loop-gap resonators 30 and 31, they will not couple with a uniform excitation field regardless of its orientation. Thus, the planar pair may be isolated from a circularly polarized excitation field.

In addition, each loop-gap resonator 30 and 31 includes a second gap 40 and 41 respectively, which also contributes to the resonant frequency of the linked pair. Perhaps more importantly, it has been discovered that by using loop-gap resonators with a plurality of gaps as shown in FIG. 3, the sensitivity of the local probe to changes in the dielectric properties of the subject being examined can be reduced. As a result, the necessity of retuning the local probe to the desired resonant frequency when the probe is moved to different regions of the anatomy or is applied to different patients is substantially reduced.

If there are n identical gaps in the loop-gap resonator, each of these gaps has a capacitance of $n \times C$, where C is the total capacitance of the loop-gap resonator. The energy stored in each gap is $\frac{1}{2}(n \times C)(V')^2$ and the total energy is $n \times \frac{1}{2}(n \times C)(V')^2$. If a single gap were used, the total energy would be $\frac{1}{2}CV^2$, and since these energies must be equal, then:

$$(V'/V) = (1/n)$$

The use of n gaps thus reduces the potentials across each gap by a factor of n. This reduces the electric fields, and in turn, reduces the sensitivity to changes in the dielectric properties of the subject being examined.

Referring particularly to FIG. 4a, a pair of loop-gap resonators 50 and 51 are formed on a molded plastic supporting structure 52 and are oriented to form an axial pair. The supporting structure 52 is formed as two separate sections 52a and 52b, with each section having a circular cylindrical tube 53a and 53b and an attached arm 54a and 54b. They are molded from polyvinyl chloride. The arm 54a telescopes within the arm 54b and a fastener 55 extends through the arms 54a and 54b to hold them together. A pair of slots 56 and 57 are formed in the arm 54a, and by loosening the fastener 55, the length of the arms 54a and 54b can be adjusted to alter the axial spacing between the loop-gap resonators 50 and 51.

Figure 4B:
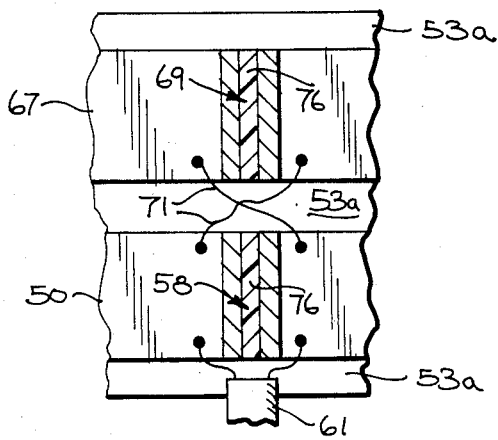
FIG. 4b is a partial cross sectional view taken along the plane 4b—4b shown in FIG. 4.

Referring particularly, to FIGS. 4a and 4b, the gaps 58 and 59 on the respective loop-gap resonators 50 and 51 are connected together as described above to provide a region of relatively uniform sensitivity 60 therebetween. These connections are made by two pieces of 300 ohm antenna wire 61 and 62 which are equal in length and are joined at a variable capacitor 63 that is mounted in the wall of the arm 54b. By adjusting the value of the capacitor 63, the resonant frequency of the axial pair 50 and 51 can be precisely tuned to the frequency of the FID signal emanating from a subject 64 disposed in the region 60. An electrical signal is produced across the plates of the capacitor 63 by the FID signal, and this electrical signal may be coupled to the inputs of a receiver. This construction is particularly well suited for examining the arms and legs of a patient, as well as portions of the torso.

As indicated above, when the local probe is used to receive the FID signals, a separate coil is employed to produce the excitation field $B_1$. During the generation of each excitation pulse $B_1$, it is highly desirable to minimize the magnitude of the signal which this field induces in the local probe. Referring again to FIG. 4a, the component of the excitation field $B_1$ in the direction indicated by an x axis 65 will not induce a voltage in the loop-gap resonators 50 or 51. However, the component in the direction indicated by a Y axis 66 will couple with the loop-gap resonators 50 and 51, and will produce a large signal which is applied to the inputs of the attached receiver.

To substantially eliminate this problem, a second, substantially identical loop-gap resonator 67 and 68 is formed adjacent to the respective loop-gap resonators 50 and 51. As shown in FIGS. 5a–5d, the structure of FIG. 4a has four resonant modes. The mode of FIG. 5a is the desired mode, with the flux lines 73 linking the loop-gap resonators 50 and 51, and with equal but opposite flux lines passing through the separate, unlinked loop-gap resonators 67 and 68. The modes of FIGS. 5b and 5c are suppressed with the connections provided by wires 61 and 62 to the loop-gap resonators 50 and 51. The fourth mode of FIG. 5d has a resonant frequency substantially different than the desired mode, and any signals or noise at this frequency can be "tuned out" with filters at the input to the receiver. In the alternative, as shown in FIGS. 4a and 4b, this fourth mode can also be suppressed by electrical cross connections 71 which are made between corresponding gaps 69 and 58 in the resonator pair 67 and 50, and electrical cross connections 72 which are made between corresponding gaps 59 and 70 in the resonator pair 51 and 68. Such cross connections between two loop-gap resonators suppress the linked resonant mode therebetween, but has little effect on the unlinked resonant mode.

Referring again to FIG. 4a, an FID signal emanating from the region 60 will induce a signal in the axial pair 50 and 51, but a substantially uniform excitation field $B_1$ passing through all four loop-gap resonators 67, 50, 51 and 68 will not. Thus, by providing matched pairs of coaxially aligned loop-gap resonators as shown in FIG. 4, the local probe may be substantially isolated from the excitation field $B_1$.

The local probe of FIG. 4 may, of course, be constructed in a variety of sizes to operate at different frequencies. In the preferred embodiment each loop-gap resonator 67, 50, 51 and 68 has a radius (r) of 4 inches, an axial length (z) of 2 inches and 2 gaps. The loops are formed of sheet copper which is bonded to the inside wall of the cylindrical tube 53. The gaps are formed by bending the end portions of the sheet copper inward and separating them with an insulating layer 76 as shown in FIG. 4b. These inward extending tabs are trimmed in size to tune the axial pair 50 and 51 to the resonant frequency of the gyromagnetic material, which in the preferred embodiment is 63.89 MHz.

Figure 6:
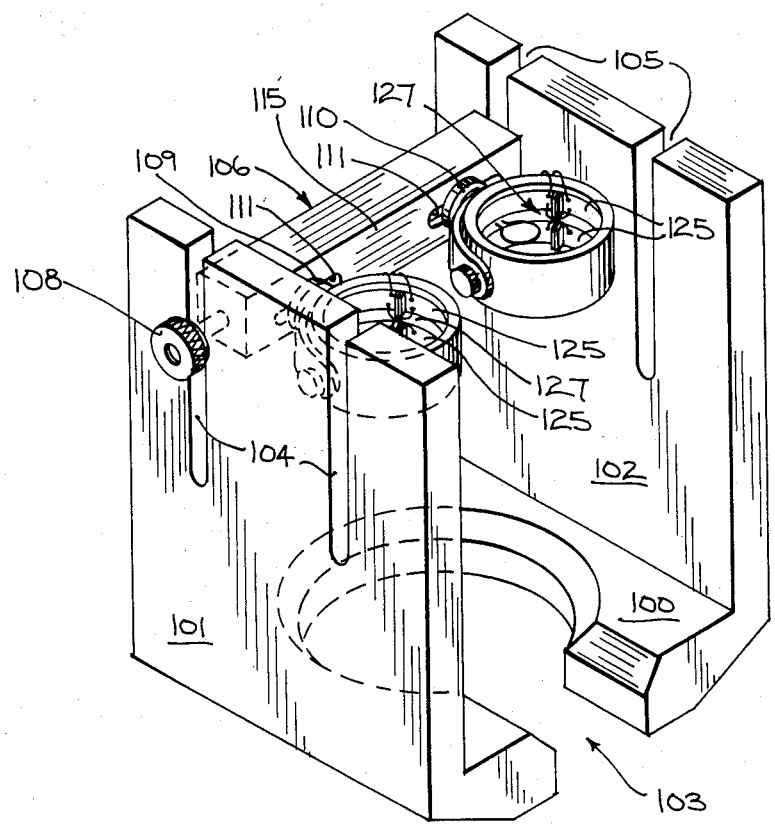
FIG. 6 is a perspective view of a second preferred embodiment of the invention.
Figure 7:
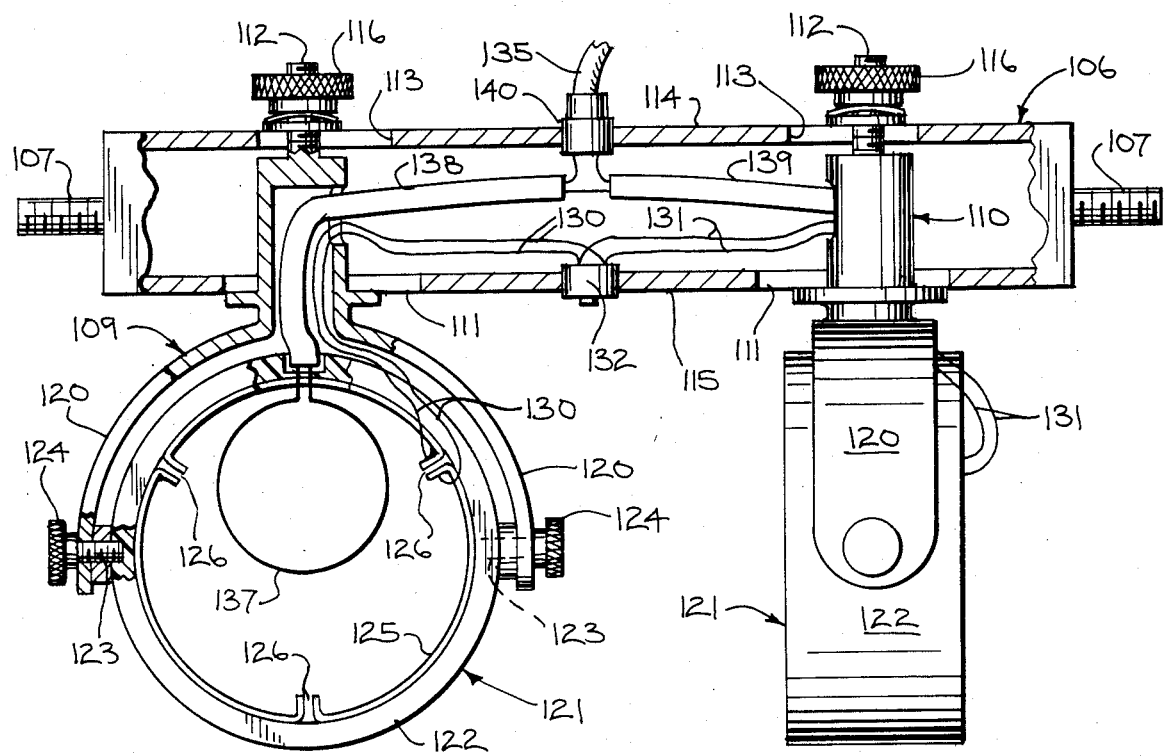
FIG. 7 is an elevation view with parts cut away of the support arm and loop-gap resonators which form a part of the embodiment of FIG. 6.

A second preferred embodiment of the invention which is particularly suited for examining the head and neck regions of a human subject is shown in FIGS. 6 and 7. A supporting structure includes a base 100 having a pair of attached upright sidewalls 101 and 102 which are spaced apart 10.5 inches. A contoured opening 103 is formed in the base 100 for receiving the back of the subject's head and neck, and the bottom of the base is contoured to rest securely in the bore of the NMR scanner's magnet. The base 100 and the sidewalls 101 and 102 are formed from a transparent polymer such as that made from a methyl methacrylate and sold under the trademark "Plexiglas".

Two pairs of vertical slots 104 and 105 are formed in the respective sidewalls 101 and 102 for receiving a support arm 106. Threaded rods 107 extend from the ends of the support arm 106 and are received in one of the slot pairs 104 and 105. A knurled, brass nut 108 is received on each rod 107 and may be tightened to fasten the support arm 106 at the desired height and angular orientation in the slots 104 and 105.

Supported from the arm 106 is a pair of yokes 109 and 110 which extend into openings 111 in the bottom 115 of the support arm 106 and which include threaded rods 112 that extend out through opening 113 in its top wall 114. Knurled brass nuts 116 are received on the threaded rods 112, and these may be tightened to securely fasten the yokes 109 and 110 in place. The yokes 109 and 110 may be rotated within the openings 111 and 113, and the openings 111 and 113 are elongated along the axis of the support arm 106 to enable the lateral spacing of the yokes 109 and 110 to be adjusted.

Each yoke 109 and 110 includes a pair of arms 120 which extend away from the support arm 106 and which rotatably support a cylindrical probe assembly 121 therebetween. The probe assemblies 121 are identical, and each includes a circular cylindrical tube 122 made of polyvinyl chloride. A pair of threaded rods 123 extend radially outward from opposite sides of the tubes 122 and these are rotatably received in openings in the ends of the yoke arms 120. Knurled brass nuts 124 are received on the ends of the threaded robs 123, and these may be hand tightened to lock the probe assemblies 121 to the yokes 109 and 110 in the desired angular orientation.

Referring still to FIGS. 6 and 7, each probe assembly 121 includes a pair of loop-gap resonators 125 formed on the inside surface of the tube 122. The loop in each resonator 125 is formed by three strips of copper foil which are bonded to the tube 122, and the ends of each strip are folded radially inward to form three gaps, or capacitive elements 126. Each loop has a radius (r) of 1.5 inches and an axial length (z) of 0.5 inches. The two loop-gap resonators 125 are spaced apart 0.25 inches and the capacitive elements 126 are trimmed to provide a resonant frequency of 63.89 MHz.

As explained above with respect to the structure of FIG. 4a, the two sets of loop-gap resonators have four resonant modes, and only one of these is desirable. One of the undesired modes is suppressed by cross connections 127 at one of the gaps 126 in each of the loop-gap resonators 125 as described above. One of the loop-gap resonators 125 from each probe assembly 121 are connected together to suppress two of the other undesired resonant modes. As described above, this is accomplished by electrically connecting the corresponding plates at one of their respective gaps 126 by flexible, insulated wires 130 and 131. The wires 130 and 131 extend into the support arm 106 where they connect together across a variable capacitor 132. The capacitor 132 is mounted in the bottom wall 115 of the support arm 106 and its value can be manually adjusted to precisely tune the linked pair to the frequency of the FID signal.

The shape and size of the region of sensitivity thus produced will depend on the physical orientation of the probe assemblies 121. They can be positioned as a linked axial pair as in FIG. 2, or they can be positioned as a linked planar pair as in FIGS. 3 and 6. They can also be locked into a variety of other positions ranging between the axial pair and planar pair orientations. When employed in the supporting structure 100-102, this embodiment of the invention is well suited for examining the head and neck regions of a patient. The support arm 106 can also be removed from this support structure and used separately to image other regions such as the spine.

Referring particularly to FIGS. 7 and 8, the FID signals which are detected by the probe assemblies 121 are magnetically coupled to a transmission line 135 that connects to the receiver 136 of the NMR scanner. This is accomplished by mounting a coupling coil 137 within each probe assembly 121. The coupling coils 137 are made of #12 copper wire and each is a single turn having a diameter of approximately 1.5 inches. The ends of the coupling coils 137 are connected to coaxial cables 138 and 139 which are fed into the support arm 106. One lead of each cable 138 and 139 connects to respective leads in the transmission line 135 through a connector 140, and the other leads in each cable 138 and 139 connect together. As shown in FIG. 8a, the connections are made such that when the probe assemblies 121 are oriented as a planar pair, any currents induced in the coupling coils 137 by a uniform excitation field ($B_1$) are equal and opposite. Similarly, as shown in FIG. 8b, when the probe assemblies 121 are oriented as an axial pair any currents induced by a uniform excitation field ($B_1$) are equal and opposite. This symmetry minimizes the electrical signal which will be applied to the receiver 136 during the excitation period of each measurement cycle.

Figure 11A:
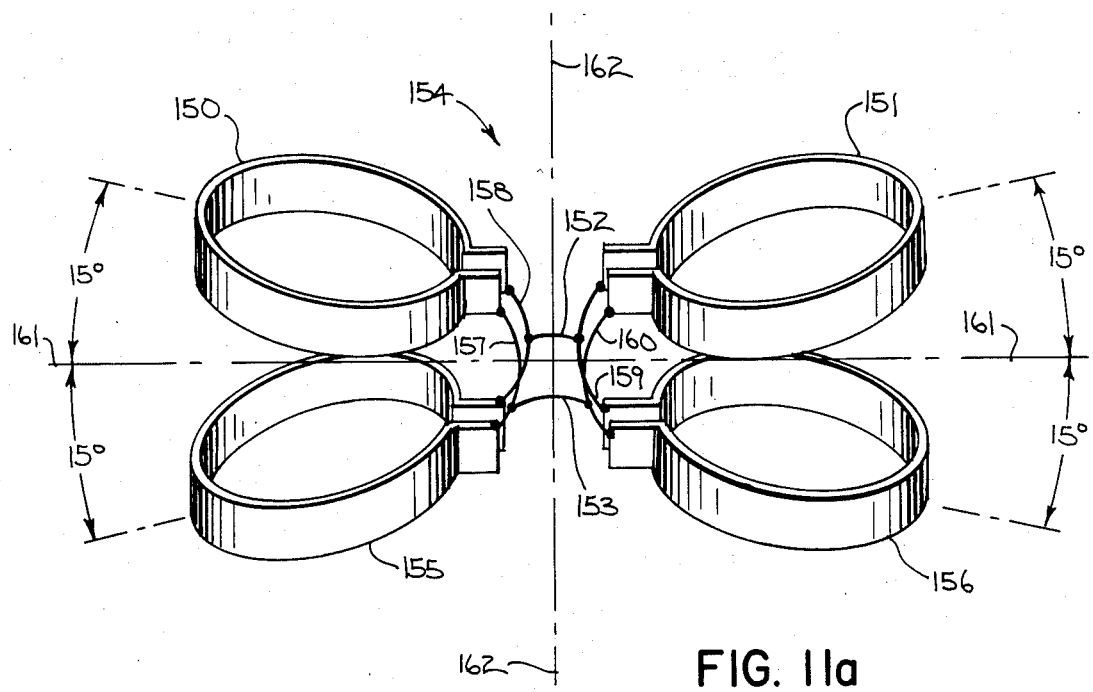
FIGS. 11a and 11b are perspective views of a third preferred embodiment of the invention.

Other variations from the axial pair and planar pair constructions are possible without departing from the spirit of the present invention. In the embodiment shown in FIG. 11a, for example, loop-gap resonators 150 and 151 are connected together by wires 152 and 153 to produce a region 154 of relatively uniform sensitivity therebetween. This embodiment is specifically designed to image sections of the human spinal column, and to more accurately focus, or shape, the sensitivity region 154 to this region of interest. To accomplish this, each loop-gap resonator 150 and 151 is tilted 15 degrees out of the planar orientation.

While this particular orientation improves the quality of spinal column images, the loop-gap resonator pair 150-151 is no longer geometrically isolated from the excitation field $B_1$. One solution to this problem is to add a pair of separate, axial loop-gap resonators as was done in the embodiments of FIGS. 4a and 6. However, there is yet another solution when tilting a planar pair in this fashion. A second pair of tilted loop-gap resonators 155 and 156 may be connected to the first pair 150 and 151. The loop-gap resonation 155 is connected by wires 157 and 158 to the resonator 150 to resonator therewith in the linked mode. Similarly, the loop-gap resonator 156 is connected to the loop-gap resonator 151 by wires 159 and 160 to resonate therewith in the linked mode. As a result, the probe is geometrically symmetrical about an x axis 161 and about a y axis 162. This symmetry isolates the probe from a uniform excitation field $B_1$ of any orientation.

Figure 11B:
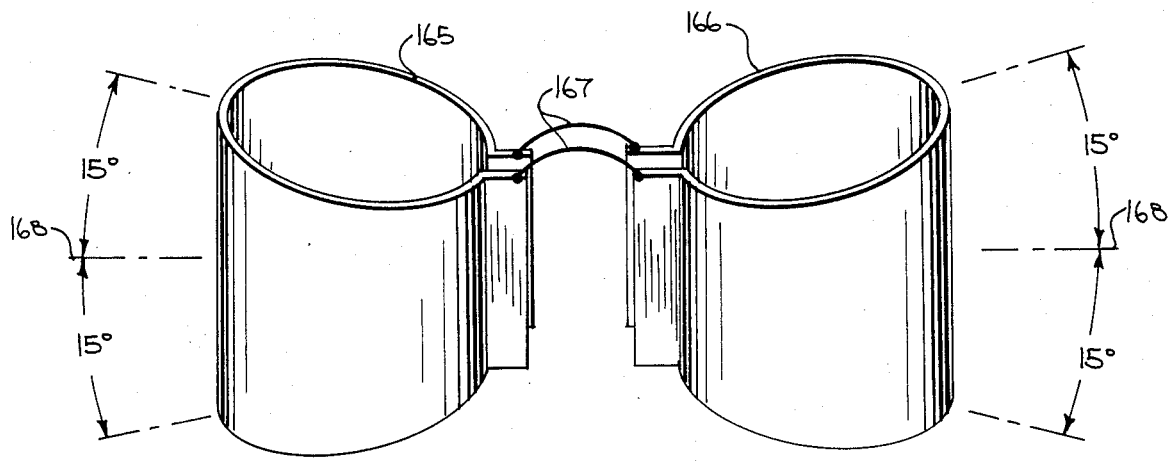

A substantially equivalent structure is shown in FIG. 11b, where two loop-gap resonators 165 and 166 are positioned as a planar pair and are connected at 167 to resonate in their linked mode. In this embodiment the ends of each loop-gap resonator 165 and 166 are tilted 15 degrees with respect to an axis 168 through their common plane to shape the region of uniform sensitivity while maintaining symmetry.

Figure 9:
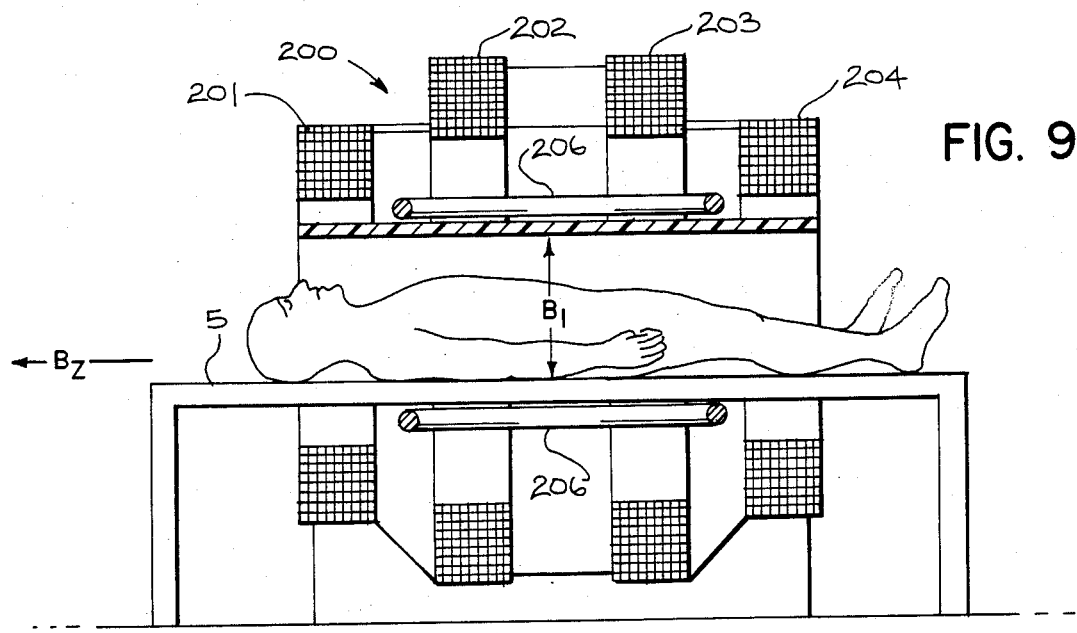
FIG. 9 is a schematic representation of an NMR scanner which employs the present invention.
Figure 10:
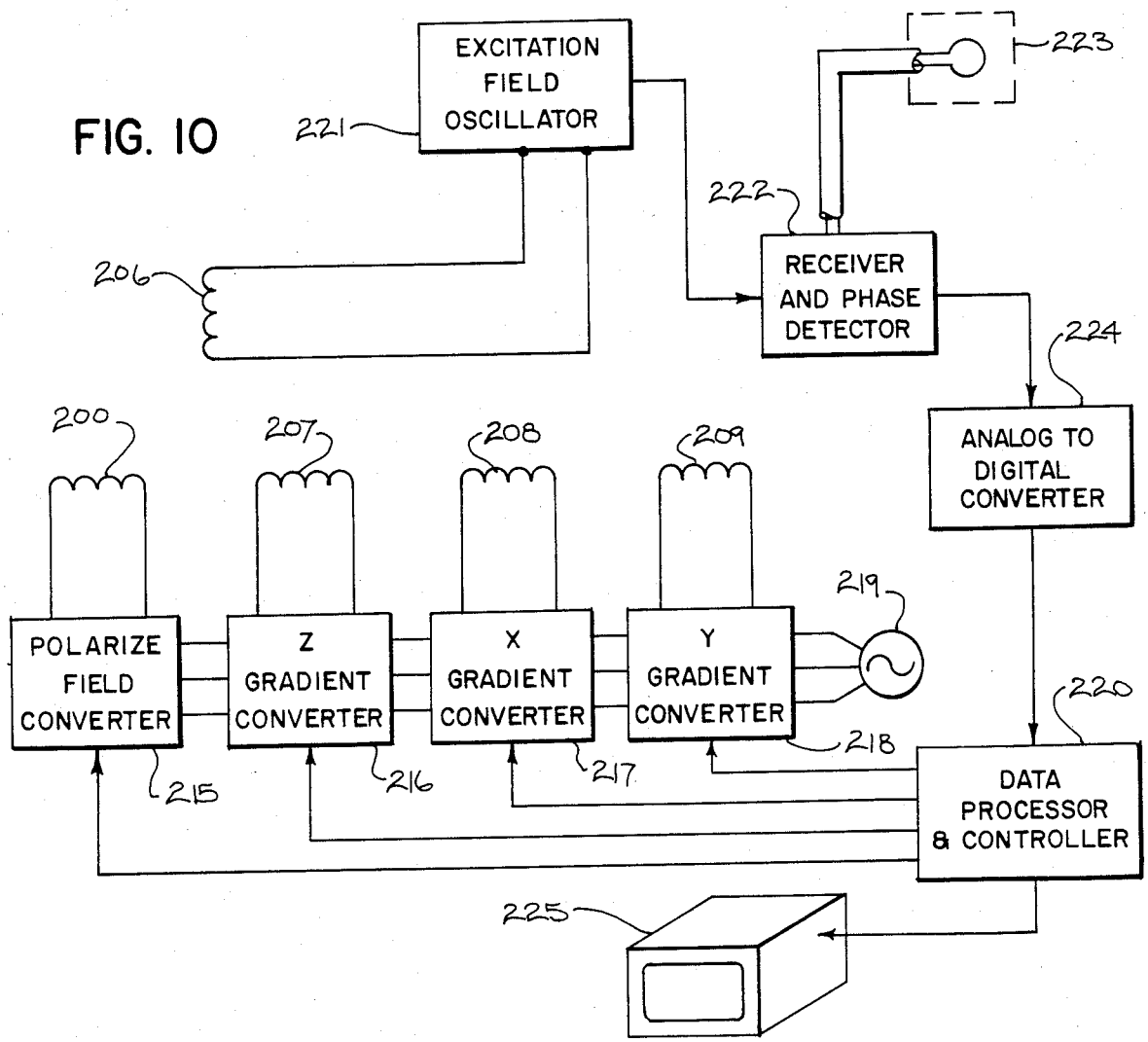
FIG. 10 is an electrical schematic diagram of the NMR scanner of FIG. 9.

Referring particularly to FIGS. 9 and 10, although the present invention may be easily implemented in a variety of NMR scanner or NMR spectrometer structures, the preferred embodiments of the invention have been employed to detect the FID signals produced in a large, whole-body NMR scanner. Referring particularly to FIG. 9, this scanner employs a polarizing magnet 200 which is comprised of four circular cylindrical segments 201-204 of sufficient size to receive a table 205. A patient may be placed on the table 205 and any portion of his body may be scanned by suitably positioning him with respect to a set of excitation coils 206. The polarizing magnet 200 produces a strong magnetic field $B_z$ which is constant and homogeneous within the space defined by the excitation coils 206. The excitation coils 206 produce an excitation field $B_1$ which is in the transverse plane, perpendicular to the polarizing field $B_z$. The excitation field $B_1$ oscillates at a radio frequency $\omega_0 = 63.89$ MHz and it is applied as one or more pulses during each measurement cycle. There are also three sets of gradient coils 207-209 (not shown in FIG. 9) which produce magnetic field gradients in the region between the excitation coils 206.

Referring particularly to FIG. 10, the control system for the NMR scanner includes a set of four static power converters 215-218 which connect to an a.c. power source 219. The static converters 215-218 produce d.c. currents for the respective coils 200, 207-209 at levels determined by commands received from a processor 220. Both the magnitude and the direction of the gradient fields in the x, y and z directions are controlled by the processor 220 to "scan" a region between the excitation coils 206 and reconstruct an image from the FID signals which are produced.

The processor 220 also controls the operation of an excitation field oscillator 221 which is connected to the excitation coils 206 and which is turned on and off during each measurement cycle of the scanning process. The oscillator 221 also provides a reference signal to a receiver and phase detector circuit 222 which in turn is connected to receive the FID signal from a local probe 223. The FID signal is amplified and detected by the circuit 222 and is then applied to the input of an analog-to-digital converter 224. The digitized FID signals are processed using well-known NMR imaging techniques, and image data is produced by the processor 220 for display on a CRT 225.

By using the local probes of the present invention, images of improved quality are produced. This improvement results from a number of factors. The loop-gap resonators employed in the local probes have a higher quality factor than prior probes or receiver coils used for this purpose. This improves the signal-to-noise ratio of the FID signals applied to the receiver 222, and hence, the signal quality. As described above, the present invention also enables local probes to be configured to image specific parts of the human anatomy. By properly orienting the loop-gap resonators, the region of sensitivity of the local probe may be "shaped" to encompass only the region of interest in the human subject. This improves FID signal quality and the quality of the resulting image.

And finally, the local probe of the present invention may be constructed to provide geometric isolation from the excitation field ($B_1$). As a result, the receiver 222 need not be turned off each time the excitation coils 206 are energized. This not only simplifies the control circuitry, but also, it enables the local probe 223 to be oriented in any direction within the excitation field ($B_1$) without inducing excessive currents or voltages. This is particularly important where the excitation coils 206 are configured to produce a circularly polarized excitation field ($B_1$), which has components in both the x and y directions. Prior local probes cannot be oriented to receive the FID signals and avoid coupling with both of these excitation field components. This same geometric isolation characteristic is also of benefit during the receive portion of each measurement cycle, since it provides some degree of immunity to extraneous noises produced by other coils or sources.

We claim:

1. A local probe for use in nuclear magnetic resonance imaging, the combination comprising:
    a first loop-gap resonator having a gap formed by a pair of spaced plates and a conductive loop which connects to the spaced plates and encircles a resonator axis;
    a second loop-gap resonator having a second gap formed by a second pair of spaced plates and a second conductive loop which connects to the second plates and encircles a second resonator axis;
    support means connected to the first and second loop-gap resonators for positioning said loop-gap resonators adjacent to one another;
    connection means for electrically connecting each plate in the first loop-gap resonator to a respective plate in the second loop-gap resonator to suppress an unlinked resonant mode of the first and second loop-gap resonators; and
    coupling means positioned adjacent to the first and second loop-gap resonators for coupling signals detected by the first and second loop-gap resonators out of the local probe.

2. The local probe as recited in claim 1 in which each loop-gap resonator is pivotally connected to the support means such that the loop-gap resonators may be oriented in a number of positions ranging from an axial pair orientation to a planar pair orientation.

3. The local probe as recited in claim 1 in which the support means includes adjustment means for changing the lateral spacing between the first and second loop-gap resonators.

4. The local probe as recited in claim 1 in which each loop-gap resonator includes a plurality of gaps.

5. The local probe as recited in claim 1 in which the connection means includes a pair of flexible, electrically insulated wires.

6. The local probe as recited in claim 5 in which a variable capacitor is connected across the wires and the capacitor may be adjusted to alter the resonant frequency of the loop-gap resonators.

7. The local probe as recited in claim 1 in which the first and second loop-gap resonators are substantially identical, and the coupling means comprises a pair of substantially identical coupler coils connected in series across a transmission line and mounted adjacent the respective first and second loop-gap resonators to produce a signal on the transmission line which is responsive to the magnetic field produced in a region of sensitivity located between the loop-gap resonators.

8. In an NMR scanner for producing images from FID signals emanating from a subject which is irradiated with an excitation field in the presence of a polarizing magnetic field, a local probe for receiving the FID signals emanating from a region of interest in the subjust, which comprises:
a pair of loop-gap resonators, each loop-gap resonator being placed adjacent to the region of interest;
connection means for electrically connecting the loop-gap resonators together at their respective gaps to suppress a resonance mode characterized by separate, unlinked magnetic flux paths in the two loop-gap resonators, and to support a resonance mode characterized by a magnetic flux path which links the two loop-gap resonators and which resonates at the frequency of the FID signals; and
conductive means positioned adjacent the pair of loop-gap resonators for receiving the FID signals emanating from the region of interest.

9. The local probe as recited in claim 8 in which the excitation field is circularly polarized and the loop-gap resonators are substantially identical and oriented as a planar pair.

10. The local probe as recited in claim 8 in which the conductor means is formed as a pair of coupler coils, with one coupler coil positioned adjacent each loop-gap resonator, and with both coupler coils connected in series across a transmission line.

11. The local probe as recited in claim 8 in which the loop-gap resonators are oriented as an axial pair with the region of interest disposed between the loop-gap resonators.

12. The local probe as recited in claim 8 in which the loop-gap resonators are fastened to support means that enables the position of the loop-gap resonators to be adjusted with respect to each other and to the region of interest.

13. In an NMR scanner for producing images from FID signals emanating from a subject which is irradiated with an excitation field in the presence of a polarizing magnetic field, a local probe for receiving the FID signals emanating from a region of interest in the subject, which comprises:
a pair of coupler coils;
support means connected to the coupler coils for positioning them adjacent to one another and adjacent to the region of interest in the subject;
a pair of loop-gap resonators connected to the support means, each loop-gap resonator being positioned adjacent to a respective one of the coupler coils and being tuned to resonate at the frequency of the FID signals produced in the region of interest;
a transmission line attached to the support means and leading to a receiver which processes the FID signals; and
connection means for electrically connecting each coupler coil to the transmission line and in series with each other such that FID signals emanating from the region of interest produce a corresponding electrical signal in the transmission line;
wherein the coupler coils are symmetrical such that signals induced in one coupler coil by the excitation field substantially cancels the signal induced in the other coupler coil by the same excitation field.

14. The local probe as recited in claim 13 in which the loop-gap resonators are substantially identical.

15. The local probe as recited in claim 13 in which each loop-gap resonator has a plurality of gaps.

16. In an NMR scanner for producing images from FID signals emanating from a subject which is irradiated with an excitation field in the presence of a polarizing magnetic field, a local probe for receiving the FID signals emanating from a region of interest in the subject, which comprises:
a first axial pair of loop-gap resonators placed adjacent to the region of interest;
a second axial pair of loop-gap resonators placed adjacent to the region of interest and spaced from the first axial pair of loop-gap resonators;
connection means for electrically connecting a loop-gap resonator in each of said axial pairs together to suppress an unlinked resonant mode and to thereby produce a relatively uniform sensitivity to FID signals emanating from the region of interest; and
coupling means positioned adjacent to the first and second axial pairs for coupling signals detected by the first and second axial pairs out of the local probe.

17. The local probe as recited in claim 16 in which each axial pair includes cross connections between the loop-gap resonators within each axial pair to suppress a linked resonant mode and to thereby unlink the loop-gap resonators in each axial pair.

18. The local probe as recited in claim 16 in which each axial pair of loop-gap resonators is positioned with respect to each other such that their area of uniform sensitivity is shaped to substantially correspond to the region of interest.

19. A local probe for use in nuclear magnetic resonance imaging, the combination comprising:
a pair of loop-gap resonator sections which are oriented as a planar pair about a common axis between the resonators; and
connection means for connecting corresponding capacitive elements in each loop-gap resonator section together;

wherein each loop-gap resonator section includes a loop having opposite ends which are tilted with respect to the common axis and are symmetrical about the common axis.

20. The local probe as recited in claim 19 in which each loop-gap resonator section is comprised of a pair of loop-gap resonator which are tilted with respect to the common axis such that each defines one of said opposite ends.

* * * * *